United States Patent [19]

Mullen, III et al.

[11] Patent Number: 4,889,275
[45] Date of Patent: Dec. 26, 1989

[54] METHOD FOR EFFECTING SOLDER INTERCONNECTS

[75] Inventors: William B. Mullen, III; Douglas W. Hendricks, both of Boca Raton, Fla.

[73] Assignee: Motorola, Inc., Schaumburg, Ill.

[21] Appl. No.: 266,470

[22] Filed: Nov. 2, 1988

[51] Int. Cl.$^4$ .......................... B23K 1/20; B23K 31/00
[52] U.S. Cl. .................. 228/180.2; 228/203; 228/248
[58] Field of Search .................. 228/173.1, 180.2, 203, 228/248, 15.1; 219/121.6, 121.63–121.66, 121.85; 174/68.5

[56] References Cited

U.S. PATENT DOCUMENTS

| 3,589,591 | 6/1971 | Schwenn . | |
|---|---|---|---|
| 3,713,575 | 1/1973 | Cushman . | |
| 3,926,360 | 12/1975 | Moister, Jr. | 228/248 |
| 4,319,708 | 3/1982 | Lomerson . | |
| 4,412,642 | 11/1983 | Fisher, Jr. . | |
| 4,562,637 | 1/1986 | Kushima et al. | 228/180.2 |
| 4,661,192 | 4/1987 | McShane | 228/180.2 |
| 4,752,027 | 6/1988 | Gschwend | 228/180.2 |

FOREIGN PATENT DOCUMENTS

| 74147 | 6/1980 | Japan | 228/180.2 |
|---|---|---|---|
| 2179578 | 3/1987 | United Kingdom | 228/180.2 |

OTHER PUBLICATIONS

IBM Technical Disclosure Bulletin, "Simultaneous Laser-Assisted Solder Reflow on Double-Sided . . . Carriers", vol. 31, No. 6, pp. 7–9, Nov. 1988.

Primary Examiner—Richard K. Seidel
Assistant Examiner—Samuel M. Heinrich
Attorney, Agent, or Firm—Daniel K. Nichols

[57] ABSTRACT

A method for effecting high density solder interconnects between a substrate and at least one metalized film having through holes therein is provided. Solder is first applied to metalized portions of the substrates and the solder is then subject to a reflow process to provide reflowed solder. Pressure is applied to the reflowed solder during a second reflow process to provide pre-stressed or shaped solder. The metalized film is then positioned with at least one metalized portion adjacent to the shaped solder. Heat, as from a laser, is directed through the through holes in the film to melt the solder and form solder interconnections between the substrate and the metalized film.

8 Claims, 3 Drawing Sheets

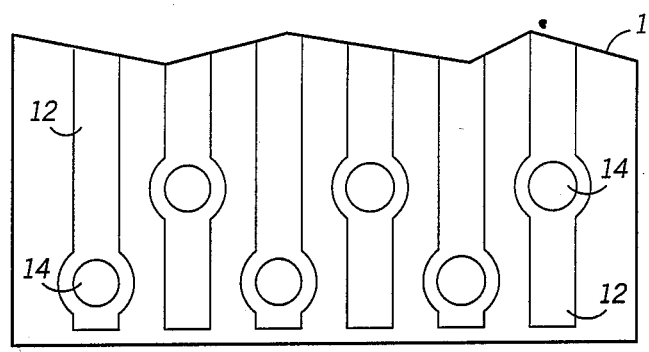
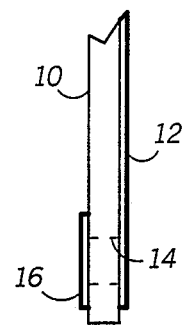
FIG.1  FIG.2
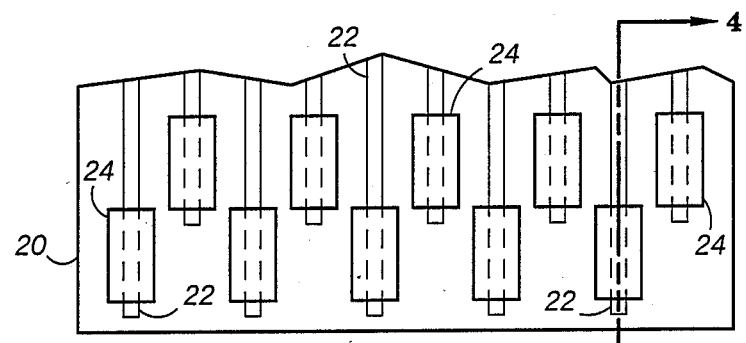
FIG.3
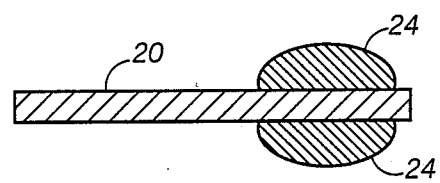
FIG.4

METHOD FOR EFFECTING SOLDER INTERCONNECTS

BACKGROUND OF THE INVENTION

This invention relates generally to a method for effecting solder interconnects and particularly to a method for producing high density interconnects. Certain applications, such as PLZT substrates, require extremely high density of interconnects. With such devices, it is necessary for the interconnect approach to be volumetrically efficient. To achieve a high density of interconnections, it is common to utilize mechanical, pressure type, connections which can result in undesirable contact resistances. Where solder type processes are utilized, dimensional problems can result with mass bonding of materials whose thermal coefficients of expansion differ. Thermal expansion can result in misalignment due to temperature excursions experienced in a soldering process.

SUMMARY OF THE INVENTION

The method for effecting solder interconnects permits high density solder interconnects without the thermal expansion problems experienced by other solder techniques. The method of forming solder interconnects includes the steps: of applying solder to metalized portions of the substrate, applying pressure to the solder during a reflow process in which the solder is prestressed, positioning a metalized film having through holes against the prestressed solder with at least one metalized portion of the film adjacent to the shaped solder, and applying heating energy through the through holes to melt the prestressed solder and form solder interconnections between the substrate and the metalized film.

In one aspect of the invention, the applied solder is reflowed a first time prior to the application of pressure in the second reflow process. In another aspect of the invention, laser energy is directed through the through holes to melt the solder. In yet another aspect of the invention a second metalized film is similarly soldered to a second side of the substrate. In one aspect of the invention, the solder is printed on the metalized portions, while in another aspect of the invention, solder paste is applied to the metalized portions.

BRIEF DESCRIPTION OF THE DRAWINGS

FIG. 1 is a top plan view of a metalized film for use in the present invention.

FIG. 2 is a side view of the metalized film of FIG. 1

FIG. 3 is a top plan view of a substrate with solder already applied.

FIG. 4 is a cross-sectional view taken along line 4—4 of FIG. 3 after the solder has been reflowed.

DESCRIPTION OF THE PREFERRED EMBODIMENT

Figure 5:
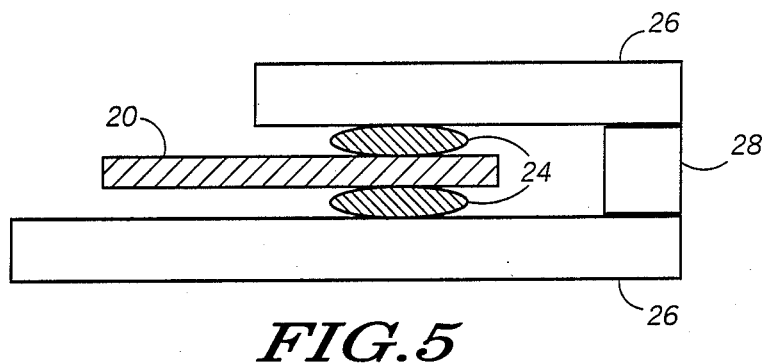
FIG. 5 is a side elevational view, partially in cross section, showing pressure being applied to the solder on the substrate.

Referring now by characters of reference to the drawings and first to FIG. 1, it will be understood that a film 10, which can be a polyimide film, includes a plurality of metalized traces 12. As is shown in FIG. 2, metalized through holes 14 interconnect traces 12 with metalized traces 16 on the opposite side of the film 10. One or more metalized films such as film 10 may be provided for attachment to a substrate 20.

An electrical substrate 20 is illustrated in FIG. 3. The substrate 20 includes metalized traces (or portions) 22. As illustrated, solder pads 24 have already been applied to the substrate 20. The solder pads 24 can be applied by a printing process, by a paste process, or by other suitable well known solder application methods. The solder pads 24 preferably are greater in width than the width of the traces 22, thereby providing sufficient solder to achieve the geometry illustrated in FIG. 4 when the solder pads 24 are reflowed. The substrate 20 can be provided with a polyimide mask which covers the substrate surface and traces 22 except for the rectangular areas where the solder pads 24 are applied.

Figure 6:
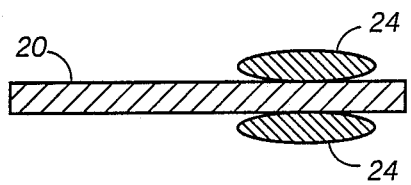
FIG. 6 is a cross-sectional view of the substrate after completion of the operation of FIG. 5.

After the first reflow process, pressure is applied to the solder pads 24 by flat members or tools 26 which are separated by fulcrum 28 as illustrated in FIG. 5, while the solder is reflowed a second time. The solder pads 24 are then cooled and the tools 26 are removed providing the flattened shaped pad geometry illustrated in FIG. 6. The shaped solder pads 24 are then in a prestressed condition.

Figure 7:
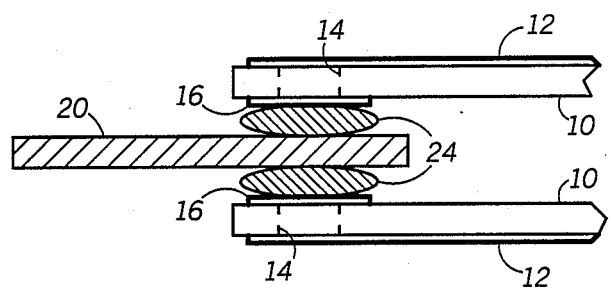
FIG. 7 is side elevational view, partially in cross-section, showing metalized film positioned against both sides of the substrate.
Figure 8:
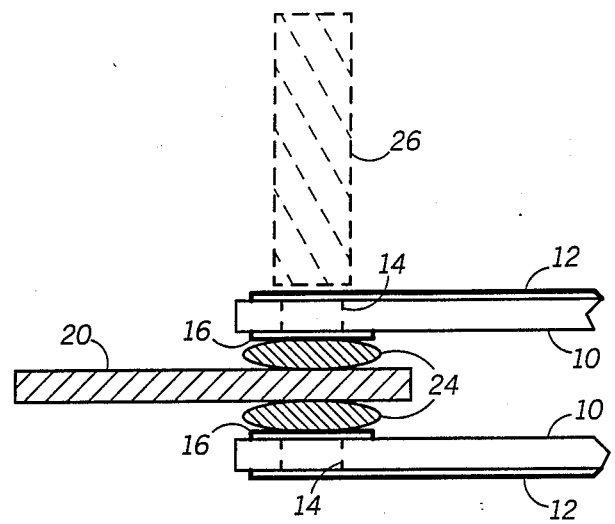
FIG. 8 is a similar view to FIG. 7, showing a laser heating operation.
Figure 9:
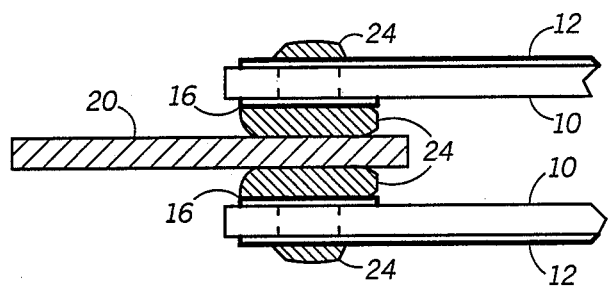
FIG. 9 is a side elevational view, partially in cross-section, showing the two layers of film soldered to the substrate.

As is illustrated in FIG. 7, film 10 is in position with at least one metalized portion 16 adjacent to the shaped solder pads 24. The metalized portion 16 can either be in direct contact with the solder pad 24 or can be closely spaced therefrom. The through hole 14 is located directly above the solder pad 24. Heat energy, such as from a laser beam 26, is then applied through the through hole to the solder pad 24 causing the solder pad to melt and wet the metalized portion 16 of the film 10 and reform up through the metalized hole 14 thereby forming a solder interconnection between the substrate 20 and the metalized film. Where a second film 10 is utilized, on the opposite side of substrate 10, the laser process is also applied to provide the solder interconnections to both of the films 10 as is illustrated in FIG. 9.

This method of forming solder interconnects is particularly useful where a high density of interconnects is required, as when the substrate 20 is PLZT. If desired the two reflow steps could combined into a single reflow operation. The use of laser energy applied directly to the solder pads 24 limits the thermal expansion of the film 10 and substrate 20 as the heating is local rather than general. The prestressing or distorting of the solder pads 24, preconditions the solder to rise when it is reheated to a fluid state.

We claim as our invention:

1. A method of forming solder interconnects, comprising the steps of:

applying solder to metalized portions of a substrate, applying pressure to the solder during a reflow process to prestress the the solder, positioning at least a metalized portion of a film having through holes therein adjacent to the prestressed solder, applying heating energy through the holes to melt the solder and form solder interconnections between the substrate and the metalized film.

2. A method of forming solder interconnects as defined in claim 1 wherein after applying solder to the metalized portions the solder is reflowed.

3. A method of forming solder interconnects as defined in claim 1, wherein solder is printed on the metalized portions.

4. A method of forming solder interconnects as defined in claim 1, wherein solder paste is applied to the metalized portions.

5. A method of forming solder interconnects as defined in claim 1, wherein laser energy is directed through the holes to melt the solder.

6. A method of forming solder interconnects as defined in claim 1, wherein a second metalized film is similarly soldered to a second side of the substrate.

7. A method of forming solder interconnects as defined in claim 1, wherein the metalized film is polyimide.

8. A method of forming solder interconnects comprising the steps of:

applying solder to metalized portions of a substrate, reflowing the solder to provide reflowed solder, applying pressure to the reflowed solder during a second reflow process to provide shaped solder, positioning a metalized film having through holes therein against the shaped solder such that at least one metalized portion of the film is adjacent to the shaped solder, and applying laser heating energy through the holes to melt the solder and form solder interconnections between the substrate and the metalized film.

* * * * *